(12) United States Patent
Sugiura

(10) Patent No.: US 7,833,903 B2
(45) Date of Patent: Nov. 16, 2010

(54) SEMICONDUCTOR DEVICE AND METHOD OF MANUFACTURING THE SAME

(75) Inventor: Kazuhiro Sugiura, Chiba (JP)

(73) Assignee: Seiko Instruments Inc. (JP)

( * ) Notice: Subject to any disclaimer, the term of this patent is extended or adjusted under 35 U.S.C. 154(b) by 96 days.

(21) Appl. No.: 11/705,708

(22) Filed: Feb. 13, 2007

(65) Prior Publication Data

US 2007/0200191 A1 Aug. 30, 2007

(30) Foreign Application Priority Data

Feb. 18, 2006 (JP) .............................. 2006-041689
Jan. 29, 2007 (JP) .............................. 2007-017604

(51) Int. Cl.
*H01L 21/4763* (2006.01)

(52) U.S. Cl. ........................ 438/648; 438/637; 438/639; 438/642

(58) Field of Classification Search ................. 257/296, 257/347, 530, 760; 438/151, 237, 600, 622, 438/638, 639, 648, 694, 700, 706, 720, 725
See application file for complete search history.

(56) References Cited

U.S. PATENT DOCUMENTS

| | | | | |
|---|---|---|---|---|
| 5,440,167 A | * | 8/1995 | Iranmanesh .................. 257/530 |
| 5,451,291 A | * | 9/1995 | Park et al. ..................... 438/702 |
| 7,253,465 B2 | * | 8/2007 | Yamamoto et al. ........... 257/296 |
| 2005/0090087 A1 | * | 4/2005 | Lu et al. ....................... 438/592 |
| 2006/0105573 A1 | * | 5/2006 | Mahalingam et al. ........ 438/706 |

OTHER PUBLICATIONS

Quirk; Semiconductor Manufacturing Technology; 2001; Ch. 12 pp. 308 and 314.*
Quirk (Semiconductor Manufacturing Technology; 2001, Ch. 12 pp. 308 and 314).*

* cited by examiner

*Primary Examiner*—Thanh V Pham
*Assistant Examiner*—Errol Fernandes
(74) *Attorney, Agent, or Firm*—Adams & Wilks

(57) ABSTRACT

In a method of manufacturing a semiconductor device, a refractory metal film is stacked on a first wiring metal film. An antireflection film is deposited on the refractory metal film. A wiring including the first wiring metal film, the refractory metal film, and the antireflection film is formed, and an interlayer insulating film is formed on the wiring. The interlayer insulating film is etched to form a contact hole so that a surface of the antireflection film corresponds to an uppermost layer of the wiring and an etching by-product is produced on a sidewall of the contact hole. The etching by-product produced on the sidewall of the contact hole is then removed. Thereafter, a portion of the antireflection film located in a bottom portion of the contact hole is removed. A second wiring metal film is then deposited through the contact hole.

11 Claims, 7 Drawing Sheets

Prior Art

Prior Art

Prior Art

Prior Art

SEMICONDUCTOR DEVICE AND METHOD OF MANUFACTURING THE SAME

BACKGROUND OF THE INVENTION

1. Field of the Invention

The present invention relates to a semiconductor device having a multilayer wiring structure and a method of manufacturing the semiconductor device, and more particularly, to an antireflection film of the semiconductor device.

2. Description of the Related Art

Up to now, an antireflection film has been formed to prevent halation which causes defect at the patterning of photo resist formed on an aluminum film or an aluminum alloy film. For example, a manufacturing method of depositing a nitrided refractory metal film made of TiN, TaN, ZrN, HfN, or the like by sputtering is described in JP 01-241162 A. FIGS. 7 to 11 show an example of a multilayer wiring manufacturing process using the nitrided refractory metal film as the antireflection film.

In the application of the nitrided refractory metal film as an antireflection film to a multilayer wiring structure, requirements are not limited to merely reduce reflectance. This is because, connection at low via resistance between a lower metal line and an upper metal line through a contact hole is quite important in a semiconductor device having the multilayer wiring structure.

Since it is difficult to obtain a sufficiently low contact resistance according to the aforementioned manufacturing method described in JP 01-241162 A, in order to solve the difficulty a manufacturing method of performing heat treatment in an atmosphere containing nitrogen after the deposition of a refractory metal film to reduce the resistivity of the refractory metal film is described in JP 05-226338 A, and a manufacturing method of stacking a Ti film and a TiN film is described in JP 05-190551 A. Main reason for the use of refractory metal for an antireflection film is to improve long-term reliability. Use of aluminum or an aluminum alloy for the major interconnection is accompanied by a deterioration phenomenon in the long-term reliability of the interconnection such as electromigration and stress migration. It has been widely known that a reinforcing effect in interconnection can be obtained by using the refractory metal to achieve a high durability to the deterioration phenomenon.

One of the features in the conventional techniques is that the nitrided refractory metal film is applied to the antireflection film for the semiconductor device having the multilayer wiring structure. Application of the nitrided refractory metal film to the antireflection film causes formation of a by-product 12, which is composed of a resist, an etching gas, and the nitrided refractory metal film serving as a base, as shown in FIG. 12, along the side surface of a contact hole when the contact hole is formed with a dry etching technique. The by-product having a shape of a crown may be left as a residue in the contact hole even after a resist ashing performed after normal etching treatment, and a resist removal process involving immersion into organic peeling solution, the by-product is thus generally called crown after its shape. Hereinafter, the by-product is referred to as crown in this specification.

The crown hinders the entrance of sputtering particles into the contact hole in the deposition of the second wiring metal film by a sputtering technique while the crown 12 is produced, disabling the deposition of a film having a desirable thickness in the inner portion of the contact hole. Therefore, as shown in FIG. 13, a wiring metal film 13 is broken to reduce a yield. When the second wiring metal film is thinly deposited at a level which does not cause a break, a problem is easily expected to become more serious in view of the reliability of the semiconductor device. However, a semiconductor device including the thin second wiring metal film passes an electrical characteristic evaluation test, so that it cannot be denied that the semiconductor device is leaked as a non-defective product to the market.

JP 05-226338 A discloses an invention in which heat treatment is performed in a nitrogen atmosphere after the deposition of the refractory metal film. Requirement for the heat treatment at the temperature of approximately 450° C., in addition to an increase in the number of process steps, leads to anxiety over increase injunction leak current by wiring metal spikes to the substrate caused by deterioration of barrier metal, which is widely used to prevent mutual diffusion between a semiconductor device substrate and a wiring metal film, and also leads to easy expectation that a thickness of the refractory metal nitride layer changes relative to that of the refractory metal film by, for example, non-uniformity in the heat treatment. In the formation of an upper-layer wiring to contact with the nitrided refractory metal layer through a contact hole, contact with the refractory metal film occurs, making it difficult to obtain a stable via resistance.

JP 05-190551 A discloses a structure having a Ti film and a TiN film which are stacked by sputtering, but in the formation of the Ti film and the TiN film in different gas atmospheres in the same processing chamber, a step of forming the TiN film by sputtering and then removing a nitride layer formed on the surface of a sputtering target by an inert gas such as Ar is required for each semiconductor substrate processing. Accordingly a processing time increases and a target material other than a target material deposited on the semiconductor substrate is also consumed, consequently cost efficiency is not preferable. In the separate formation of the Ti film and the TiN film in different processing chambers, the TiN film deposited on the inner surface of the processing chamber peels because of high stress of the TiN film, so that the peeled TiN film is more likely to fall on the semiconductor substrate to cause a pattern defect in a subsequent wiring forming step, thereby reducing the yield.

SUMMARY OF THE INVENTION

An object of the present invention is to provide a semiconductor device having a multilayer wiring structure and a method of manufacturing the semiconductor device having the multilayer wiring structure, including a method of forming an antireflection film, in which no crown is produced in a contact hole, long-term reliability is high, productivity and cost efficiency are excellent, and a via hole resistance is sufficient low.

According to the present invention, to solve the above-mentioned problems, there is provided a method of manufacturing a semiconductor device having a multilayer wiring structure, including:

stacking a refractory metal film on a first wiring metal film having a barrier metal;

depositing an antireflection film on the refractory metal film;

forming a wiring including the first wiring metal film having the barrier metal, the refractory metal film, and the antireflection film;

forming an interlayer insulating film on the wiring;

forming, in the interlayer insulating film, a contact hole with the antireflection film corresponding to an uppermost layer of the wiring;

selectively removing a portion of the antireflection film which is located in a bottom portion of the contact hole after the contact hole is formed; and depositing a second wiring metal film through the contact hole.

Constituent materials used for the method of manufacturing the semiconductor device having the multilayer wiring structure are as follows. Each of the first wiring metal film and the second wiring metal film is made of aluminum or an aluminum alloy because a material cost is low. The refractory metal film is made of any one of Ti, TiW, W, Ta, and Mo in order to improve a resistance to electromigration and stress migration. The antireflection film is made of Si or an Si compound. When this material is used, an etching by-product can be easily removed by performing only normal resist ashing, for example, immersion in organic peeling solution after the formation of the contact hole, thereby preventing the production of a crown. In addition, the material has high compatibility to a process for manufacturing the semiconductor device.

With respect to a method of producing the constituent materials used for the method of manufacturing the semiconductor device having the multilayer wiring structure, a method of depositing the refractory metal film and a method of depositing the antireflection film are performed using PVD in view of productivity and cost efficiency.

In the method of manufacturing the semiconductor device having the multilayer wiring structure, the antireflection film is removed by dry etching in order to obtain a sufficient low via resistance.

Further, there is provided a semiconductor device having a multilayer wiring structure, including:

a semiconductor substrate;

a first wiring including:

a first wiring metal film having a barrier metal, which is formed on the semiconductor substrate;

a refractory metal film formed only on the first wiring metal film having the barrier metal; and an antireflection film located on the refractory metal film;

a contact hole formed on the first wiring; and a second wiring connected with the first wiring through the contact hole, in which the antireflection film is formed on a portion of the refractory metal film which is other than a region in which the contact hole is formed, and made of Si or an Si compound.

According to the present invention, a semiconductor device having a multilayer wiring structure can be manufactured in which no crown is produced in contact holes of the semiconductor device, long-term reliability is high, productivity and cost efficiency are excellent, via hole resistance is sufficient low, and variation in the resistance is small.

DETAILED DESCRIPTION OF THE PREFERRED EMBODIMENT

FIGS. 1 to 6 are process cross sectional views showing a method of manufacturing a semiconductor device having a multilayer wiring structure according to an embodiment of the present invention.

Figure 1:
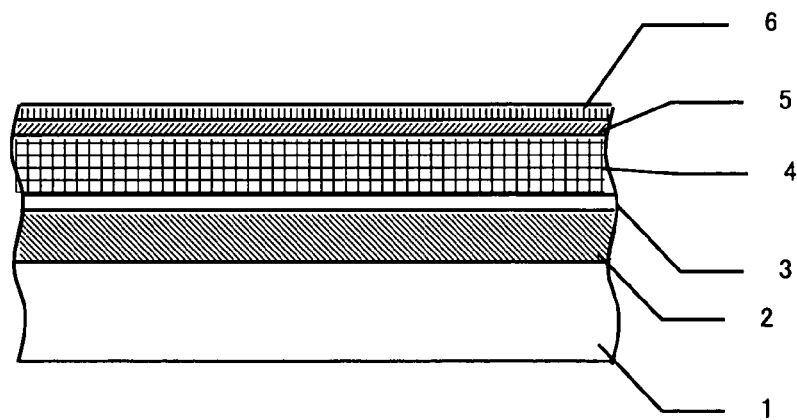
FIG. 1 is a step cross sectional view showing an embodiment of the present invention.

As shown in FIG. 1, a barrier metal 3 and a first aluminum alloy film 4 are deposited by PVD in a vacuum on an interlayer insulating film 2 deposited on a semiconductor substrate 1 and subsequently a titanium film 5 having a thickness of 10 nm to 200 nm is successively deposited for wiring reinforcement by PVD on the aluminum alloy film 4 in a vacuum without being exposed to air. The successive deposition is necessary to prevent the formation of an aluminum oxide film between the aluminum alloy film 4 and the titanium film 5, and is extremely important to obtain a low via resistance. After that, an amorphous silicon film 6 is formed as an antireflection film on the titanium film 5 by PVD at a film thickness arbitrarily selected so as to obtain desirable reflectance. In order to reduce the reflectance, it is preferable to set the film thickness of the amorphous silicon film to 100 angstroms to 200 angstroms. It is desirable to set the film thickness to 110 angstroms to 150 angstroms. It may be unnecessary to successively deposit the titanium film 5 and the amorphous silicon film 6 in a vacuum. In view of productivity, it is however desirable to successively deposit the titanium film 5 and the amorphous silicon film 6 in the same apparatus.

Figure 2:
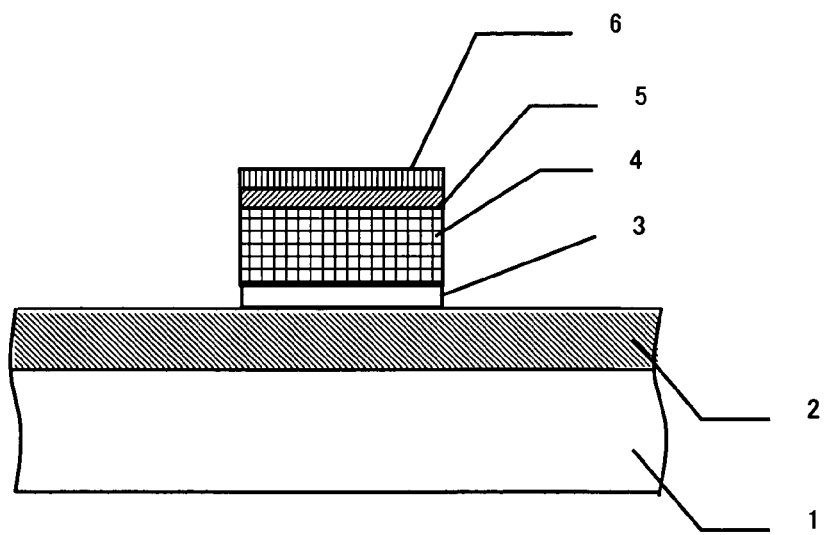
FIG. 2 is a step cross sectional view showing the embodiment of the present invention.
Figure 3:
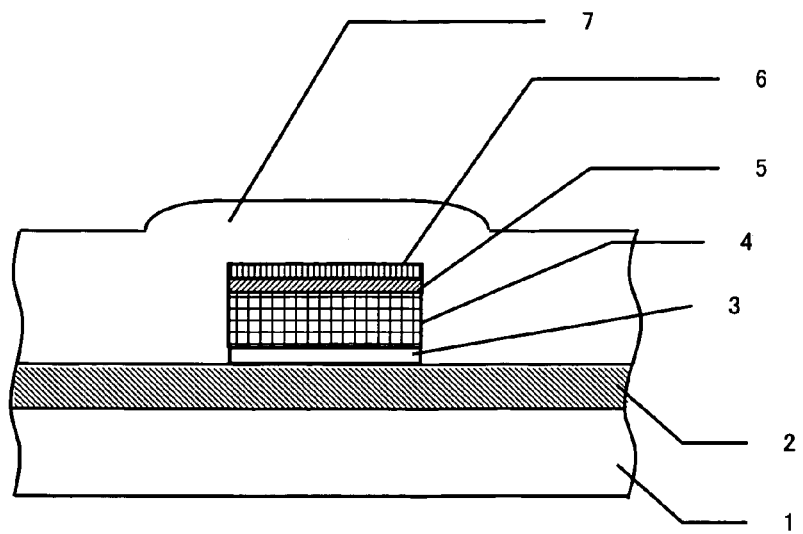
FIG. 3 is a step cross sectional view showing the embodiment of the present invention.
Figure 4:
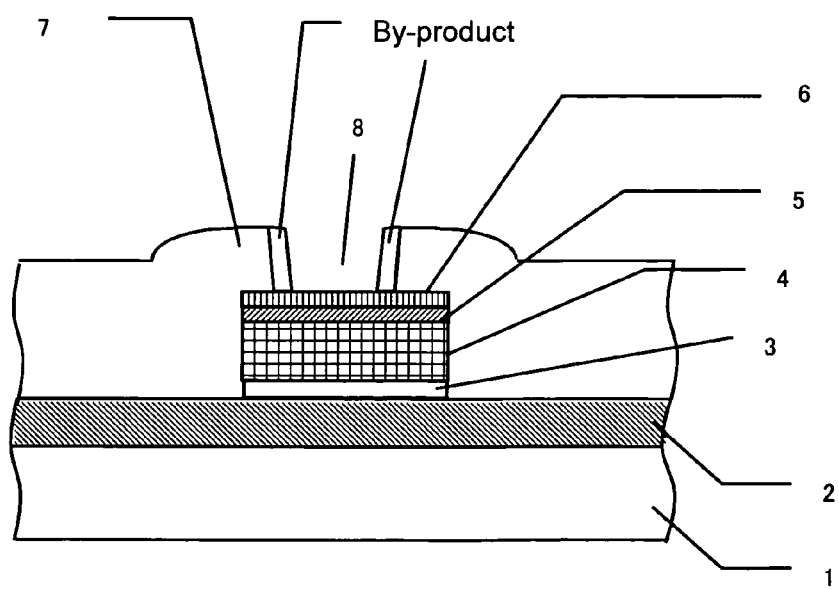
FIG. 4 is a step cross sectional view showing the embodiment of the present invention.

FIG. 2 is a process cross sectional view showing a state obtained after a wiring pattern is formed on a wiring layer having the above-mentioned film structure by a photolithography technique and a dry etching technique. Subsequently, a metal interlayer insulating film is formed as shown in FIG. 3. In order to prevent break or short-circuit of a wiring corresponding to an upper layer it is desirable to form a flat metal interlayer insulating film. A smooth metal interlayer insulating film 7 is formed by a planarization technique for performing the entire-surface etching using an SOG film as a sacrificial film or a metal interlayer planarization technique using a chemical mechanical polishing (CMP) method. Then, a contact hole 8 as shown in FIG. 4 is formed by a photolithography and a dry etching technique. Selection ratio should be adjusted to avoid complete removal of the amorphous silicon film 6 deposited as shown in FIG. 1 in the over-etching time of the dry etching of the contact hole.

There is an advantage that the selection ratio to the amorphous silicon film 6 can be easily controlled by adjusting, for example, an etching gas mixture ratio between $CHF_3$ and $CF_4$.

Figure 5:
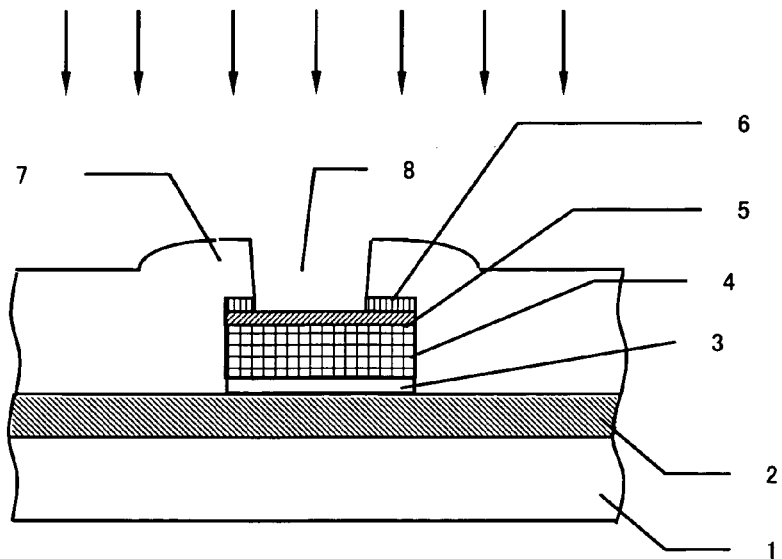
FIG. 5 is a step cross sectional view showing the embodiment of the present invention.
Figure 12:
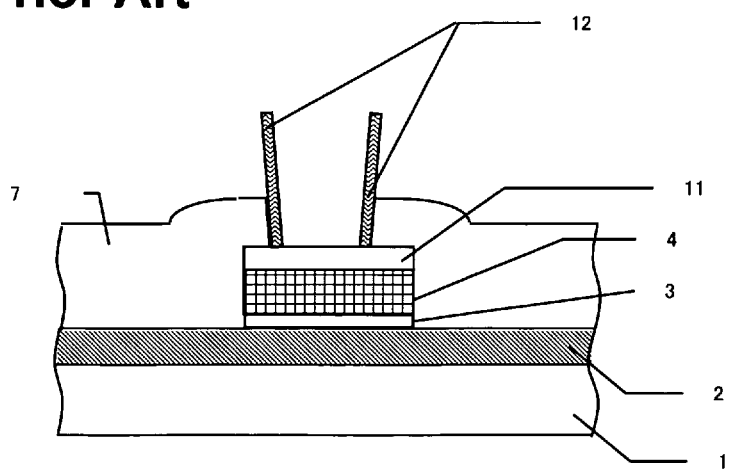
FIG. 12 is a cross sectional view showing a state in which a crown is produced in the conventional example.
Figure 13:
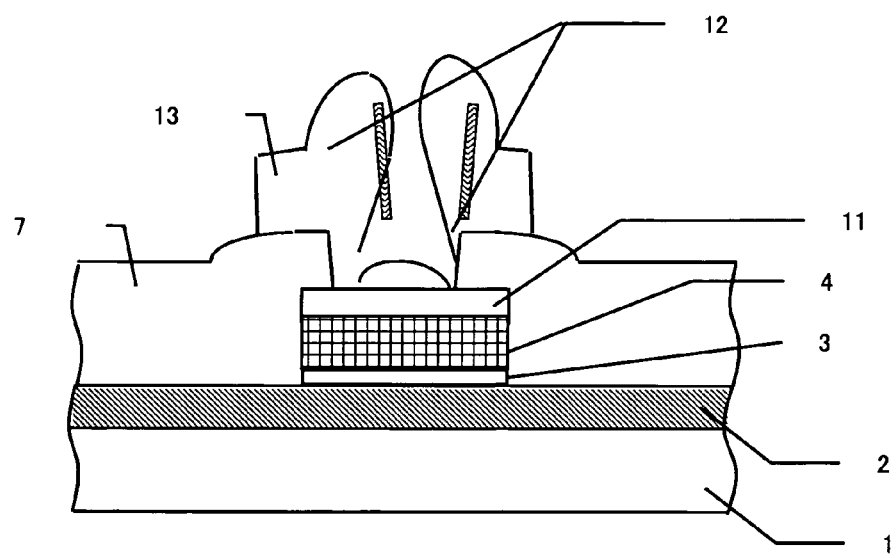
FIG. 13 is a cross sectional view showing an example of defective coverage of a metal wiring which is caused by the produced crown in the conventional example.

Subsequently, as shown in FIG. 5, in order to obtain a low via resistance, a portion of the amorphous silicon film 6 which is located in a bottom portion of the contact hole is removed by a dry etching technique. This can be easily realized by using $CF_4$ plasma and $NF_3$ plasma in an etching condition in which the selection ratio with the titanium film 5 corresponding to a lower layer is sufficiently increased. Accordingly, the titanium film 5 corresponding to the lower layer is not excessively etched, and a uniform film thickness can be obtained. Consequently a variation in resistance value which is caused by a change in film thickness of the titanium film 5 can be reduced. The amorphous silicon film 6 can be removed in the same apparatus (in-situ) after the contact hole 8 is formed by etching. Since etching by-product is, however, produced on a side wall of the contact hole, a portion of the amorphous silicon film 6 which corresponds to a thickness of the etching by-product is left. The following processing is thus desirably performed. That is, after the contact hole 8 is formed by etching, a resist and the by-product are removed by ashing, for example, immersion in organic peeling solution. Then, the portion of the amorphous silicon film 6 is etched. Use of a refractory metal film 11 including a nitrided refractory metal film (FIG. 12) as an antireflection film causes capture of a large amount of titanium by the by-product produced in etching, making it difficult to remove the by-product. According to the structure of the present invention, however, the by-product can be easily removed, sufficiently reducing the via hole resistance.

Figure 6:
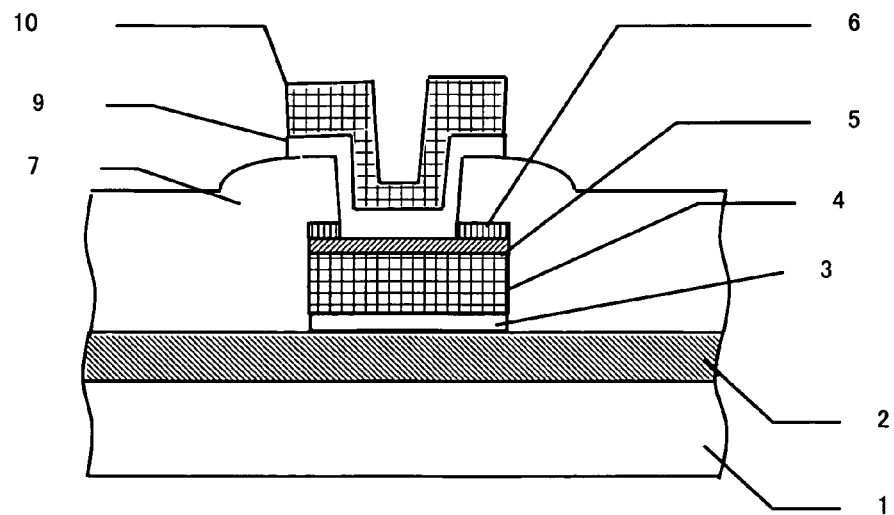
FIG. 6 is a step cross sectional view showing the embodiment of the present invention.
Figure 7:
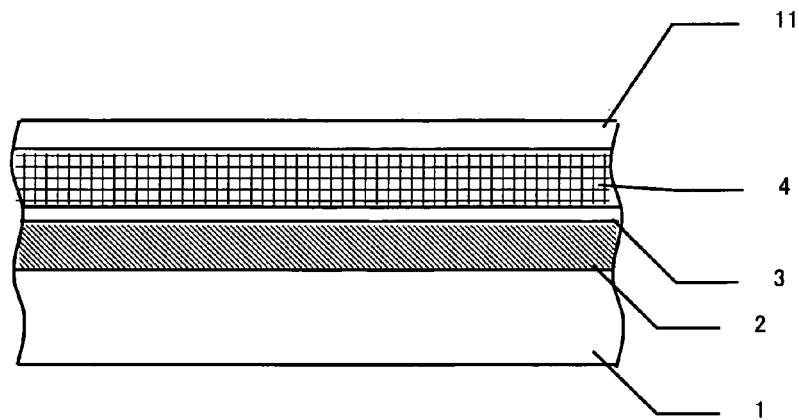
FIG. 7 is a step cross sectional view showing a conventional example.
Figure 8:
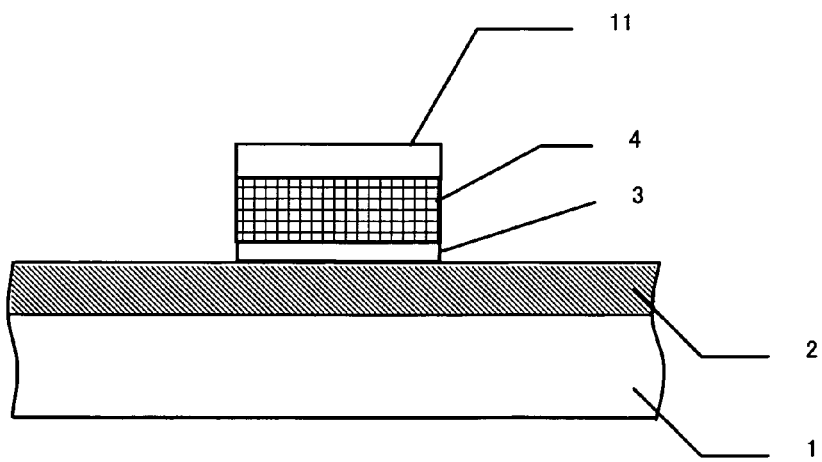
FIG. 8 is a step cross sectional view showing the conventional example.
Figure 9:
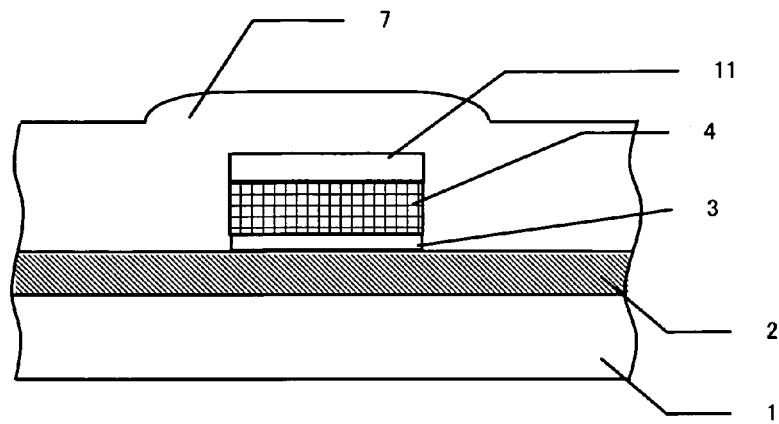
FIG. 9 is a step cross sectional view showing the conventional example.
Figure 10:
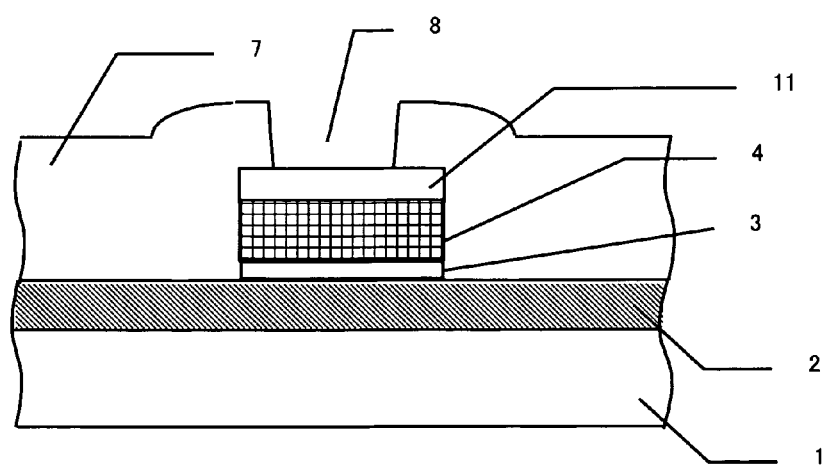
FIG. 10 is a step cross sectional view showing the conventional example.
Figure 11:
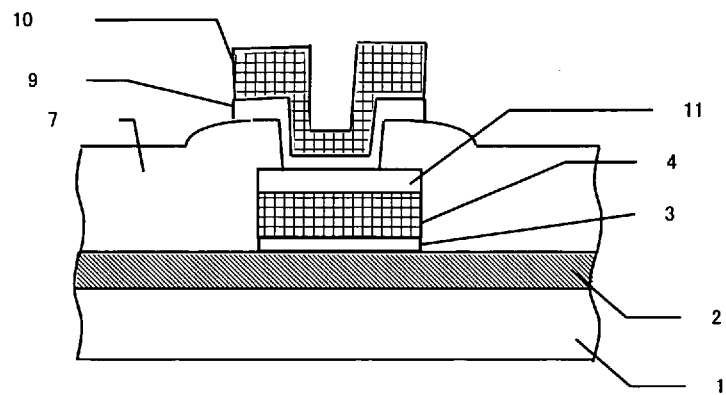
FIG. 11 is a step cross sectional view showing the conventional example.

Subsequently, a surface of the titanium film which is located in the bottom portion of the contact hole 8 is cleaned by RF etching using a PVD apparatus and then a barrier metal film 9 and a second aluminum alloy film 10 are deposited. After that, a multilayer wiring structure shown in FIG. 6 is obtained by photolithography and dry etching technique.

In this embodiment, the titanium (Ti) film is used as the refractory metal film for wiring reinforcement. Even when a film made of titanium tungsten (TiW), tungsten (W), tantalum (Ta), or molybdenum (Mo) is used, the same effect can be obtained. Even when polycrystalline silicon or a silicon compound such as a silicon nitride is used as the antireflection film in addition to the amorphous silicon, the same effect is obtained.

According to the structure of the present invention, there are provided the following advantages. The via hole resistance is sufficiently reduced. A variation in resistance is reduced. Electromigration, stress migration, or the like is prevented to improve the reliability because the refractory metal films are formed above and below the first aluminum alloy film 4.

What is claimed is:

1. A method of manufacturing a semiconductor device having a multilayer wiring structure, comprising the steps of:
   forming a first interlayer insulating film on a semiconductor substrate;
   stacking on the first interlayer insulating film a refractory metal film on a first wiring metal film having a barrier metal;
   depositing an antireflection film on the refractory metal film;
   forming a wiring including the first wiring metal film having the barrier metal, the refractory metal film, and the antireflection film;
   forming a second interlayer insulating film on the wiring;
   etching the second interlayer insulating film to form a contact hole that exposes a surface of the antireflection film so that the surface of the antireflection film corresponds to an uppermost layer of the wiring and an etching by-product is produced on a sidewall of the contact hole;
   removing the etching by-product produced on the sidewall of the contact hole;
   thereafter removing a portion of the antireflection film located in a bottom portion of the contact hole to expose a surface of the refractory metal film; and
   depositing a second wiring metal film through the contact hole.

2. A method according to claim 1; wherein each of the first wiring metal film and the second wiring metal film comprises one of aluminum and an aluminum alloy.

3. A method according to claim 1; wherein the refractory metal film comprises a metal selected from the group consisting of Ti, TiW, W, Ta, and Mo.

4. A method according to claim 1; wherein the antireflection film comprises one of Si and an Si compound.

5. A method according to claim 1; wherein the refractory metal film is deposited by physical vapor deposition (PVD).

6. A method according to claim 1; wherein the antireflection film is deposited by physical vapor deposition (PVD).

7. A method according to claim 1; wherein the portion of the antireflection film is removed by dry etching.

8. A method of manufacturing a semiconductor device, comprising the steps of:
   forming a multilayer wiring structure comprised of a substrate, a first interlayer insulating film disposed a surface of the substrate, a barrier metal disposed on the first interlayer insulating film, a first wiring metal film disposed on the barrier metal, a refractory metal film disposed on the first wiring metal film, and an antireflection film disposed on the refractory metal film;
   forming a second interlayer insulating film on the multilayer wiring structure;
   etching the second interlayer insulating film to form a contact hole that exposes a surface portion of the antireflection film and so that an etching by-product is produced on a sidewall of the contact hole;
   removing the etching by-product produced on the sidewall of the contact hole;
   thereafter etching the exposed surface portion of the antireflection film to expose a surface portion of the refractory metal film; and
   connecting via the contact hole a second wiring metal film to the multilayer wiring structure.

9. A method according to claim 8; wherein each of the first wiring metal film and the second wiring metal film comprises one of aluminum and an aluminum alloy, the refractory metal film comprises a metal selected from the group consisting of Ti, TiW, W, Ta, and Mo, and the antireflection film comprises one of Si and an Si compound.

10. A method according to claim 8; wherein the step of forming the multilayer wiring structure comprises forming each of the refractory metal film and the antireflection film by physical vapor deposition (PVD).

11. A method according to claim 8; wherein the exposed surface portion of the antireflection film is etched by dry etching.

* * * * *